(12) United States Patent
Tsai et al.

(10) Patent No.: US 9,728,573 B2
(45) Date of Patent: Aug. 8, 2017

(54) BACKSIDE ILLUMINATED IMAGE SENSOR AND METHOD OF MANUFACTURING THE SAME

(71) Applicant: TAIWAN SEMICONDUCTOR MANUFACTURING COMPANY LTD., Hsinchu (TW)

(72) Inventors: Tsung-Han Tsai, Miaoli County (TW); Yun-Wei Cheng, Taipei (TW); Chun-Hao Chou, Tainan (TW); Kuo-Cheng Lee, Tainan (TW); Yung-Lung Hsu, Tainan (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 14/600,684

(22) Filed: Jan. 20, 2015

(65) Prior Publication Data
US 2016/0211290 A1  Jul. 21, 2016

(51) Int. Cl.
*H01L 31/00* (2006.01)
*H01L 27/146* (2006.01)

(52) U.S. Cl.
CPC ...... *H01L 27/1464* (2013.01); *H01L 27/1463* (2013.01); *H01L 27/14603* (2013.01); *H01L 27/14685* (2013.01); *H01L 27/14687* (2013.01); *H01L 27/14689* (2013.01)

(58) Field of Classification Search
CPC .............. H01L 27/1446; H01L 27/146; H01L 27/1463; H01L 27/1464; H01L 27/3246
USPC .......................... 257/291, 294, 443, 446, 447
See application file for complete search history.

(56) References Cited

U.S. PATENT DOCUMENTS

| | | |
|---|---|---|
| 2008/0173963 A1 | 7/2008 | Hsu et al. |
| 2010/0065938 A1 | 3/2010 | Mabuchi |
| 2012/0025199 A1 | 2/2012 | Chen et al. |
| 2012/0034730 A1 | 2/2012 | Tu et al. |
| 2013/0134542 A1 | 5/2013 | Lu et al. |
| 2014/0015083 A1 | 1/2014 | Kao |
| 2014/0070352 A1 | 3/2014 | Tsai et al. |
| 2014/0183685 A1 | 7/2014 | Roy et al. |
| 2015/0035102 A1* | 2/2015 | Ashidate ............ H01L 27/1463 257/432 |

(Continued)

FOREIGN PATENT DOCUMENTS

| | | |
|---|---|---|
| KR | 20080069901 | 7/2008 |
| KR | 20140034033 | 3/2014 |

OTHER PUBLICATIONS

Office Action of the corresponding Taiwan application 104138923 dated Dec. 16, 2016.

(Continued)

*Primary Examiner* — Matthew E Warren
(74) *Attorney, Agent, or Firm* — WPAT, P.C.; Anthony King (57) ABSTRACT

A back side illuminated (BSI) image sensor device, includes: a substrate including a front side and a back side opposite to the front side; a radiation-sensing region disposed in the substrate; and a deep trench isolation (DTI) grid disposed in the substrate and defining the radiation-sensing region. The DTI grid extends from the back side toward the front side, and includes a segmented strip in a top view from the back side.

20 Claims, 10 Drawing Sheets

(56) References Cited

U.S. PATENT DOCUMENTS

2015/0228684 A1* 8/2015 Yamashita ........ H01L 27/14643
257/292

OTHER PUBLICATIONS

Office Action of the corresponding Korean application 10-2015-0165020 from KIPO dated Feb. 25, 2017.
US20080173963A1 corresponds to KR20080069901A.
US20140070352A1 corresponds to KR20140034033A.

* cited by examiner

BACKSIDE ILLUMINATED IMAGE SENSOR AND METHOD OF MANUFACTURING THE SAME

FIELD

The present disclosure relates to an image sensor device and in particular, to a backside illuminated image (BSI) sensor device and a method of manufacturing the BSI sensor device.

BACKGROUND

Semiconductor image sensors are used for sensing light or radiation waves. Complementary metal-oxide-semiconductor (CMOS) image sensors (CIS) and charge-coupled device (CCD) sensors are widely used in various applications such as digital camera or mobile phone camera applications.

A back side illuminated (BSI) image sensor device is one type of image sensor device. Image pixels in the BSI image sensor device generate electrical signals in response to incident light. Magnitudes of the electrical signals depend on intensity and wavelengths of the incident light received by the respective image pixels. As the size of transistor devices shrinks with each technology generation, existing BSI image sensor devices may begin to suffer from issues related to dark current or optical crosstalk. One technique for these issues may be that of forming deep trench isolations in the substrate for sufficient isolation between neighboring image pixels. However, a loading effect may occur when forming the deep trenches.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An "image pixel", as used herein, refers to a device used to capture photons, and generate electrical signals from the received photons. In some embodiments, the image pixel includes a photodiode, a transfer transistor, a floating diffusion region, a reset transistor, a source follower (common drain amplifier), and a select transistor, which is typically called a 4-T image sensor. It should be appreciated that embodiments of the present disclosure are not limited to 4-T image pixel architectures; rather, one of ordinary skill in the art having the benefit of the instant disclosure will understand that the present disclosure is also applicable to 3T designs, 5T designs, and various other image pixel architectures. During operation, incident light is received by a photodiode or pinned diode. Electron-hole pairs are generated in response to the received light. The electrons are then collected in the photodiode, and transferred into the floating diffusion region by passing through the transfer transistor. Later, the electrons are converted into electrical signals to be received within the floating diffusion region. The reset transistor is coupled between a power VDD and the floating diffusion region so as to reset the floating diffusion region to a preset voltage. The floating diffusion region is coupled to control the gate of the source follower. The source follower is coupled between the power VDD and the select transistor. The source follower is configured to provide an infinite input resistance reduced to a small output resistance. The source follower is typically used as a voltage buffer. Such resistance reduction provides a combination for a more ideal voltage source. Finally, the select transistor selectively couples the output of the image pixel to a readout column line or a readout row line.

The terms "wafer" and "substrate," as used herein, are to be understood as including silicon, silicon-on-insulator (SOI) technology, silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous processing steps may have been utilized to form regions, junctions, or material layers in or over the base semiconductor structure or foundation. In addition, the semiconductor does not need to be silicon-based, but could be based on silicon-germanium, germanium, gallium arsenide or other semiconductor structures.

The terms "deposition" and "deposit," as used herein, refer to operations of depositing materials on a substrate using a vapor phase of a material to be deposited, a precursor of the material, and an electrochemical reaction or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electro-less plating, and the like. Other examples of deposition include pulse laser deposition (PLD) and atomic layer deposition (ALD).

Deep trench isolations in a back side illuminated (BSI) image sensor device are developed, which are able to reduce crosstalk in the BSI image sensor device. In general, shallow trench isolations (STIs) are formed in a front side of a substrate, wherein the STIs isolate adjacent image pixels. However, the radiation wave is incident from the back side and must travel about 2 microns into the substrate. The STIs are relatively shallow and located on the front side so that the STIs cannot serve as guidance for the radiation wave. Photons that enter from the back side may pass under or around the STIs in order to reach radiation-sensing regions of the image pixels. This results in a crosstalk or noise in the image pixels. The deep trench isolations (DTIs) in the back side are able to isolate an array of image pixels and serve as guidance for the radiation wave. The relatively deeper depth of the DTIs can adequately block a crosstalk between adjacent image pixels.

During formation of the DTIs, deep trenches are formed by etching the substrate from the back side. The deep trenches extend from the back side toward the front side. The deep trenches define a grid pattern, which has a checkerboard form; and the grid pattern is interwoven by sets of parallel trenches in different directions. However, during etching of crossover regions of the deep trenches, a loading effect is induced at the crossover regions. At the crossover regions of the grid pattern, the crossover regions are over etched, thus having a deeper depth than the longitudinal or lateral trenches. For example, the crossover regions are 15-20% deeper than the lateral trench or the longitudinal trenches. As such, the deep trenches suffer from a loading effect at crossover regions of the grid pattern. In order to reduce the loading effect at the crossover regions, the present disclosure provides a pattern of the DTIs and manufacturing thereof.

Figure 1A:
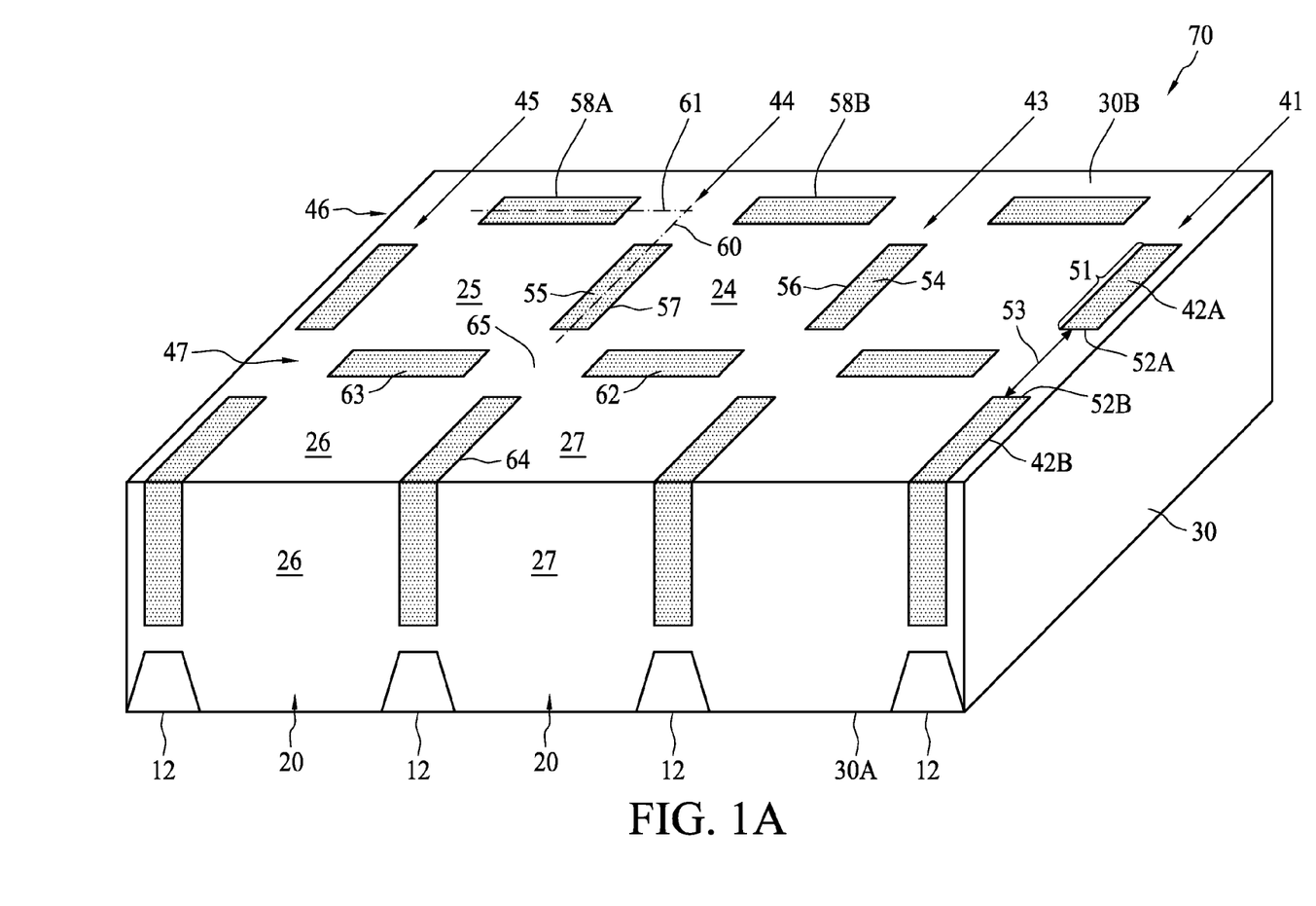
FIGS. 1A-1B represent a portion of a back side illuminated (BSI) image sensor device in accordance with some embodiments of the present disclosure.

FIG. 1A represents a portion of a back side illuminated (BSI) image sensor device in accordance with some embodiments of the present disclosure. A substrate 30 includes a front side 30A and a back side 30B. The substrate 30 is a silicon substrate or made of materials other than silicon, for example, silicon germanium, silicon carbide, germanium, III-V compound semiconductors. Isolations 12 are formed in the substrate 30 to define active regions, wherein the isolations 12 extend from the front side 30A toward the back side 30B. The isolations 12 are configured to isolate image pixels from one another. The isolations 12 are made of dielectric materials, such as oxide or nitride, by using local oxidation of silicon (LOCOS) or shallow trench isolation (STI). Those skilled in the art will understand the various steps used to form the isolations 12.

Further, image pixels (not shown) are disposed at the front side 30A and partially in the substrate 30. Each of the image pixels includes an image sensing unit of a radiation-sensing region 20, a transfer gate (not shown), and a floating diffusion region (not shown). Image sensing unit 24, 25, 26 and 27 are formed in the substrate 30. In addition, the image sensing units 24, 25, 26 and 27 are configured to receive a radiation wave that enters from the back side 30B of the substrate 30. The image sensing units 24, 25, 26 and 27 are implemented as a photodiode, a pinned photodiode, or a p-n junction disposed in the substrate 30. The image sensing units 24, 25, 26 and 27 are able to receive photons of the radiation wave from an image and convert the photons into electron-hole pairs in a depletion region. The transfer gate (not shown) is implemented as a control gate having a metal gate structure or a polysilicon gate structure. The electrons in the image sensing units 24, 25, 26 and 27 transfer to the floating diffusion region (not shown) under the control of the transfer gate. The floating diffusion region serves as a region configured for transforming the electrons into a corresponding voltage.

Further, a segmented strip 41 is disposed in the substrate 30, wherein the segmented strip 41 extends from the back side 30B toward the front side 30A. The segmented strip 41 includes sections 42A and 42B exposed on the back side 30B with a bar shape or a rectangular shape in a top view. The section 42A includes a long side 51 and a short side 52A; the section 42B includes a short side 52B. The long side 51 is in a range from about 0.6 μm to 4.5 μm, whereas the short side 52A is in a range from about 0.1 μm to 0.5 μm. The short side 52A faces the short side 52B so that the sections 42A and 42B are lined up. The sections 42A and 42B are separated by a distance 53 in a range from about 0.15 μm to 1 μm, wherein the distance 53 is measured from two adjacent short sides 52A and 52B. In an embodiment, the distance 53 is in a range from about 0.1 μm to 1.5 μm. In an embodiment, the distance 53 is in a range from about 5% to 20% of the long side 51. Alternatively, the distance 53 is in a range from about 15% to 25% of the long side 51.

In addition, segmented strips 41, 43, 44 and 45 are disposed in the substrate 30, wherein the segmented strips 41, 43, 44 and 45 extend from the back side 30B toward the front side 30A. The segmented strip 43 is substantially parallel and adjacent to the segmented strip 41; the segmented strip 44 is substantially parallel and adjacent to the segmented strip 43; and the segmented strip 45 is substantially parallel and adjacent to the segmented strip 44. Each of the segmented strips 41, 43, 44 and 45 includes several sections, wherein the sections of each segmented strip are lined up. In an embodiment, each section of the segmented strips 41, 43, 44 and 45 has the same length in the top view. For example, the section 42A or 42B has a length the same as a section 54 of the segmented strip 43. The segmented strips 41, 43, 44 and 45 define an array of the image sensing units. For example, an image sensing unit 24 is interposed between the section 54 of the segmented strip 43 and a section 55 of the segmented strip 44. Further, the section 54 is parallel to the section 55, wherein a long side 56 of the section 54 faces toward a long side 57 of the section 55.

In addition, segmented strips 46 and 47 are disposed in the substrate 30, wherein the segmented strips 46 and 47 extend from the back side 30B toward the front side 30A. The segmented strip 46 is parallel to the segmented strip 47, wherein sections of each segmented strip are lined up. In the segmented strip 46 or 47, each section has the same length. Alternatively, section lengths between the segmented strip 46 or 47 are different. In an embodiment, sections of the segmented strips 41, 43, 44 and 45 have a length different from that of the segmented strip 46 or 47. The segmented strip 46 or 47 intersects the segmented strips 41, 43, 44 and 45, wherein the segmented strips define an array of the image sensing units, thus forming a DTI grid 70 with a checkerboard pattern. For example, the segmented strips 44 and 47 separate 2×2 image sensing units 24, 25, 26 and 27. Although the segmented strip 46 or 47 intersects the segmented strips 41, 43, 44 and 45, sections of those segmented strips do not contact each other. For example, the segmented strip 47 intersects or crosses the segmented strip 44 without substantially connecting. Sections 62 and 63 of the segmented strip 47 are separated by a distance; and sections 55 and 64 are also separated by a distance. A gap 65 is at the center of the four sections 55, 62, 63 and 64. That is, the intersection of the segmented strips 44 and 47 is disconnected. In an embodiment, the segmented strip 46 orthogonally intersects the segmented strip 44, wherein a section 58A of the segmented strip 46 is adjacent to and orthogonally arranged with the section 55 without connecting. That is, a long axis of the section 55 is orthogonal to a long axis of the section 58A. In some embodiments, the section 58A angles with the section 55 by less than 90 degrees. That is, the long axis of the section 55 angles with the long axis of the section 58A by less than 90 degrees. A section 58B of the segmented strip 46 is parallel to a section 62 of the segmented strip 47, wherein the image sensing unit 24 is interposed between the section 58B and the section 62. As such, the image sensing unit 24 is surrounded by the section 54, 62, 55 and 58B. A longitudinal strip (the segmented strips 41, 43, 44 or 45) and a lateral strip (the segmented strips 46 or 47) are interwoven but not connected. Further, the sections of the segmented strips are discontinuous and isolated. During the formation of the sections, deep trenches are etched from the back side 30B where the deep trenches can be regarded as segmented ditches in a top view. Since the longitudinal and lateral segmented ditches will not form a crossover region and are not communicated, a disconnection at the intersection of the segmented ditches is able to avoid the loading effect occurred at crossover regions. That is, a crisscross or crossover region of the grid pattern is avoided so as to avoid a deeper depth of the crossover regions. The segmented ditches will have a similar depth so that each section has the same length measured from the back side 30B.

Figure 1B:
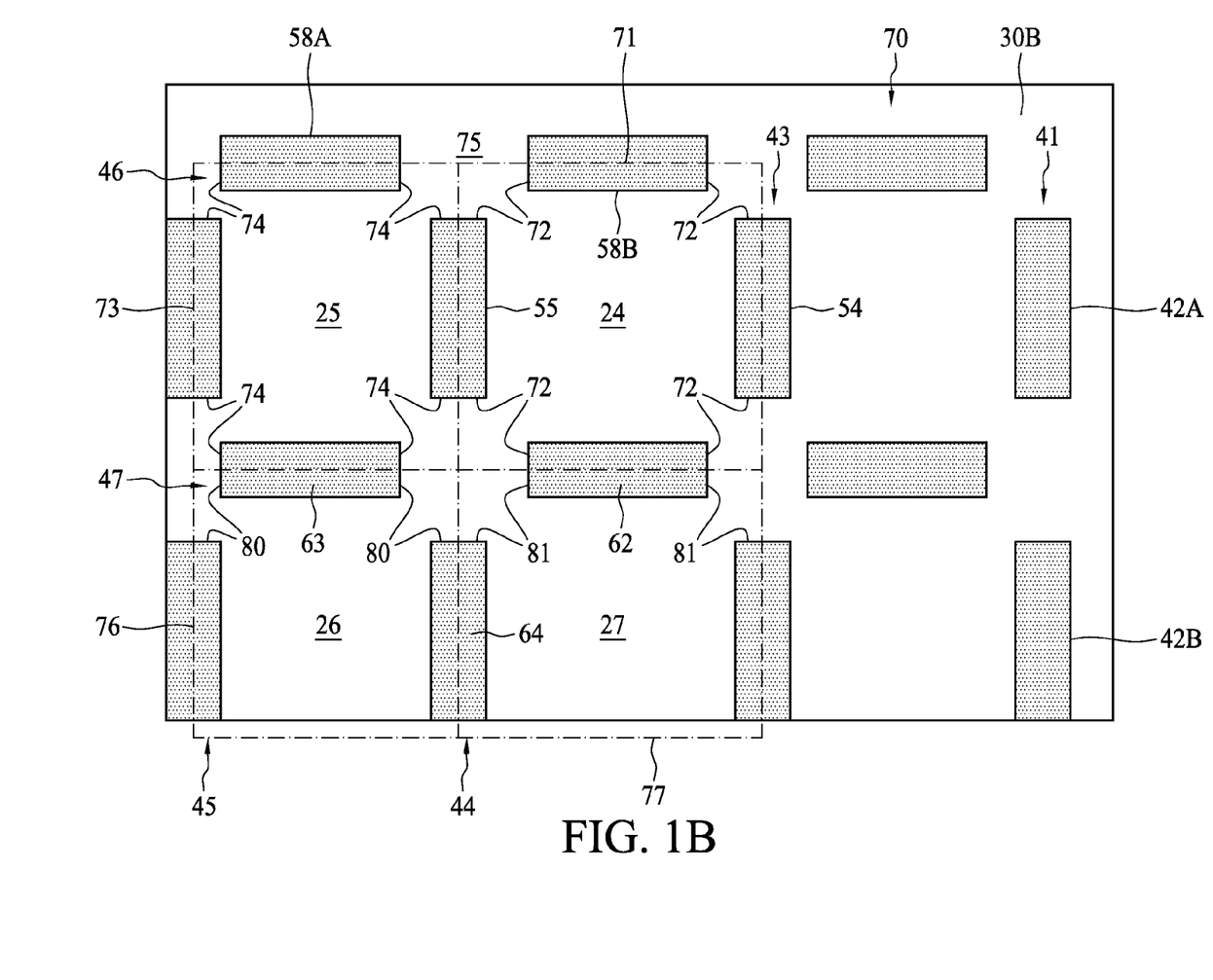

FIG. 1B represents a top view of the segmented strips of the BSI image sensor device of FIG. 1A in accordance with some embodiments of the present disclosure. An array of image sensing units 24, 25, 26 and 27 is defined by the DTI grid 70; for example, the image sensing unit 24 is surrounded by the sections 54, 55, 58B and 62. That is, the sections 54, 55, 58B and 62 can be regarded as a DTI loop 71 of the DTI grid 70, wherein the DTI loop 71 includes four open ends 72 at four corners of the DTI loop 71. Alternatively, an open end is located at a side of the DTI loop 71, thus forming a discontinuous or a cut section (not shown). In addition, the DTI grid 70 further includes laterally segmented strips 46 and 47 and longitudinally segmented strips 41, 43, 44 and 45. The segmented strips are intersected, but the intersections of the DTI grid 70 are opened. Another DTI loop 73 circulates a sensing image unit 25 and is located adjacent to the DTI loop 71, wherein the section 55 is shared by the DTI loops 73 and 71. The DTI loop 73 also includes four open ends 74 at four corners of the DTI loop 73. Another DTI loop 76 circulates a sensing image unit 26 and is located adjacent to the DTI loop 73, wherein the section 63 is shared by the DTI loops 73 and 76. The DTI loop 76 also includes open ends 80 at corners of the DTI loop 76. Another DTI loop 77 circulates a sensing image unit 27 and is located adjacent to the DTI loops 71 and 76, wherein the sections 62 and 64 are commonly shared among DTI loops 71, 76 and 77. The DTI loop 77 also includes open ends 81 at corners of the DTI loop 77. A separation 75, which also refers to an open end, is at the center of 2×2 image sensing units 24, 25, 26 and 27. The separation 75 is also at the center of the DTI loops 71, 73, 76 and 77. The separation 75 is able to avoid the loading effect occurred at the crossover regions when etching the deep trenches. Substrate material at the location of the separation 75 is remained. The deep trenches for the sections 55, 62, 63 and 64 are isolated respectively and separated by the separation 75. By using the separation 75, crossover regions of strips are avoided so as to avoid a deeper depth at crossover regions. A uniform depth of the sections 55, 62, 63 and 64 are obtained after filling dielectric materials in the deep trenches. In addition, the separation 75 is able to avoid damages or defects since a crossover region of the strips is not etched. The etching processes easily results in damages or defects (such as dangling bonds or interface charges) on the surfaces of the deep trenches at the crossover region. These defects or damages are physical defects or electrical defects and could trap carriers, such as electrons or holes. The trapped carriers are recombined and produce an unintentional radiation wave. The image sensing units falsely receive the unintentional radiation wave even when the BSI image sensor device is placed in an optically dark environment, thus forming a dark current. The dark current causes electrical crosstalk and degrades the performance of the BSI image sensor device. By implementing the separation 75, the defects or damages are not formed and allow the dark current to be reduced.

Figure 2A:
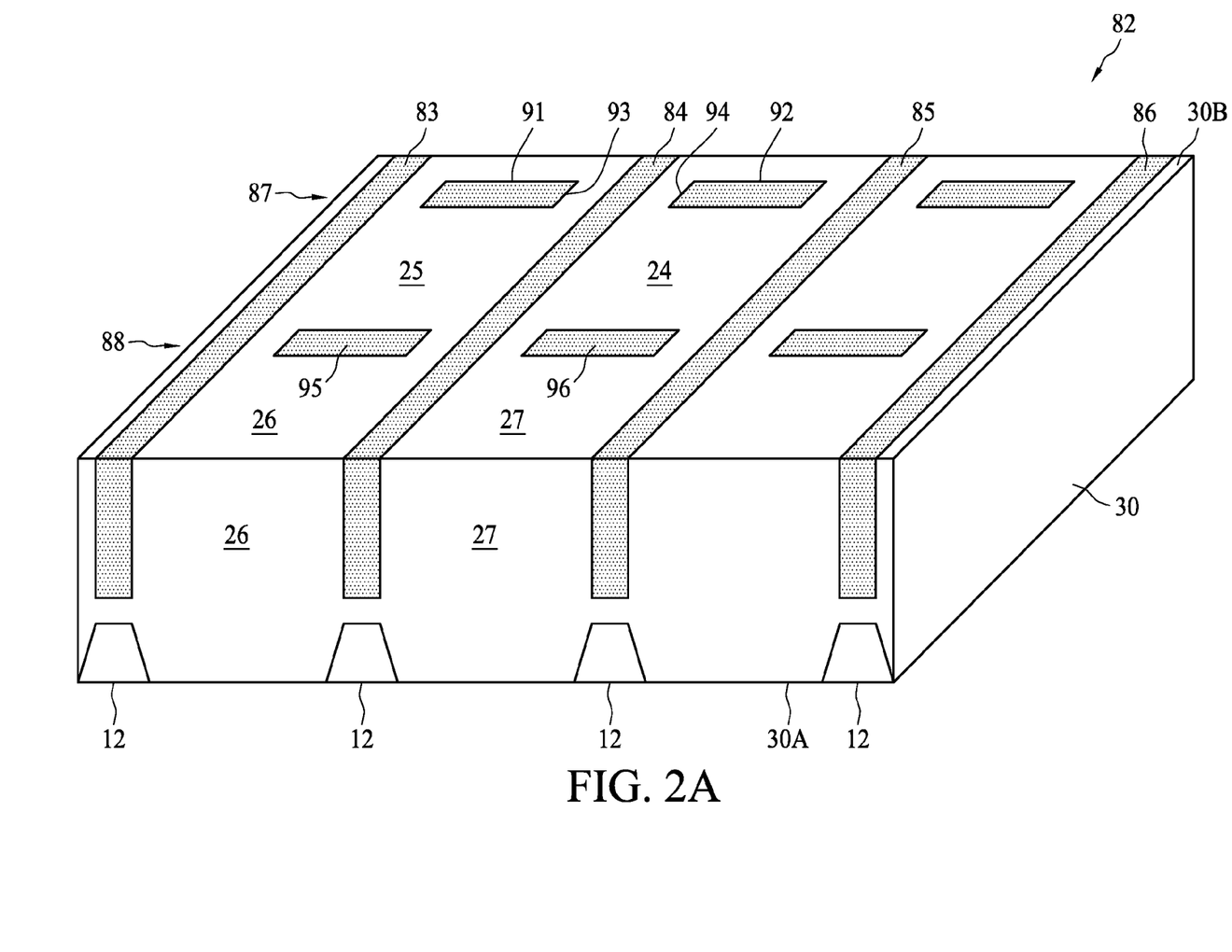
FIGS. 2A-2B represent a portion of a back side illuminated (BSI) image sensor device in accordance with some embodiments of the present disclosure.

FIG. 2A represents a portion of a back side illuminated (BSI) image sensor device in accordance with some embodiments of the present disclosure. A DTI grid 82 is formed at the back side 30B, wherein the DTI grid 82 extends from the back side 30B toward the front side 30A. The DTI grid 82 includes continuous strips 83, 84, 85 and 86 and segmented strips 87 and 88. The DTI grid 82 defines an array of image sensing units, for example, the image sensing units 24, 25, 26 and 27. The continuous strips 83, 84, 85 and 86 are in parallel to each other. For example, rows of the image sensing units, which is a row of image sensing units 25 and 26 and another row of the image sensing units 24 and 27, are separated by the continuous strip 84. The segmented strips 87 and 88 are in parallel to each other, wherein the segmented strip 87 or 88 intersects the continuous strips 83, 84, 85 and 86 without connection. The segmented strip 87 includes sections 91 and 92, wherein the continuous strip 84 is interposed between the sections 91 and 92 by a separation from each of the sections 91 and 92. Further, short sides 93 and 94 of the sections 91 and 92 face toward the continuous strip 84. The section 91 or 92 is much shorter than the continuous strip 84. Similarly, the segmented strip 88 includes sections 95 and 96, wherein the continuous strip 84 is interposed between the sections 95 and 96 by a separation from each of the sections 95 and 96. That is, the section 95 is located adjacent to but separated from the continuous strip 87 by a few microns. Further, the section 95 is in parallel to the section 91 and interposed between the image sensing units 25 and 26. The section 96 is in parallel to the section 92 and interposed between the image sensing units 24 and 27.

Figure 2B:
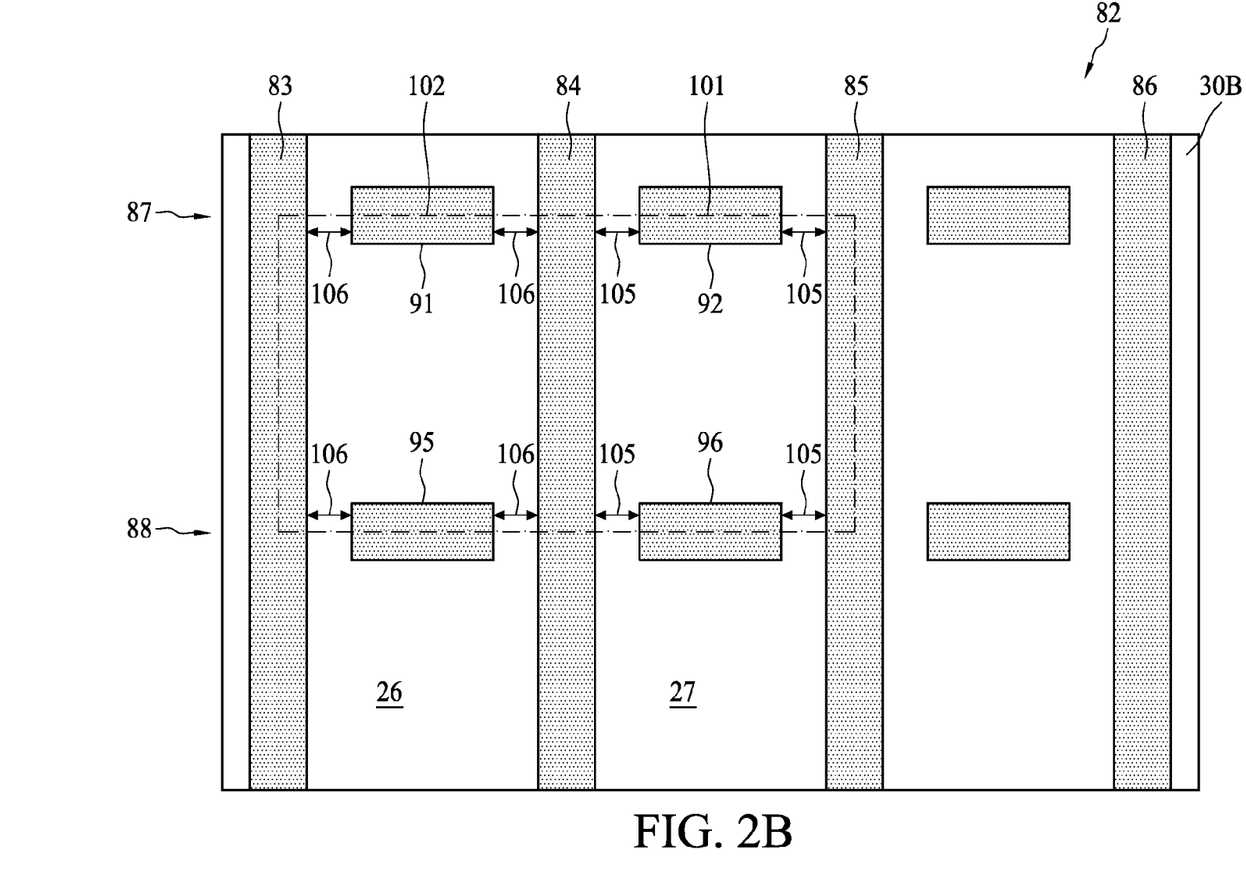

FIG. 2B represents a top view of the segmented strips of the BSI image sensor device of FIG. 2A in accordance with some embodiments of the present disclosure. The sections 92 and 96 and the continuous strips 84 and 85 can be regarded as a DTI loop 101 of the DTI grid 82, wherein the DTI loop 101 circulates the image sensing unit 24 and includes openings 105 or open ends at four corners of the DTI loop 101, resulting from a shorter length of the section 92 or 96 than a distance between the continuous strip 84 and 85. Another DTI loop 102 circulates the sensing image unit 25 and is located adjacent to the DTI loop 101, wherein the continuous strip 84 is shared by the DTI loops 101 and 102. The DTI loop 102 also includes openings 106 or open ends at four corners of the DTI loop 102, resulting from a shorter length of the section 91 or 95 than a distance between the continuous strip 83 and 84. By using the openings 105 and 106, a crossover of strips is avoided so as to reduce the loading effect occurred at crossover regions when etching the deep trenches for the strips. Deep trenches for the continuous strips (83, 84, 85, 86) or the sections (such as 92 and 95) have a uniform depth. Without the loading effect, performance of the BSI image sensor device can be improved. In addition, by using the openings 105 and 106, only the continuous strips (83, 84, 85, 86) cross the intersections of the DTI grid 82. The arrangement of the openings 105 and 106 reduces damages or defects, which are easily formed in the crossover by etching. As such, the dark current and crosstalk issues can be eliminated.

Figure 3A:
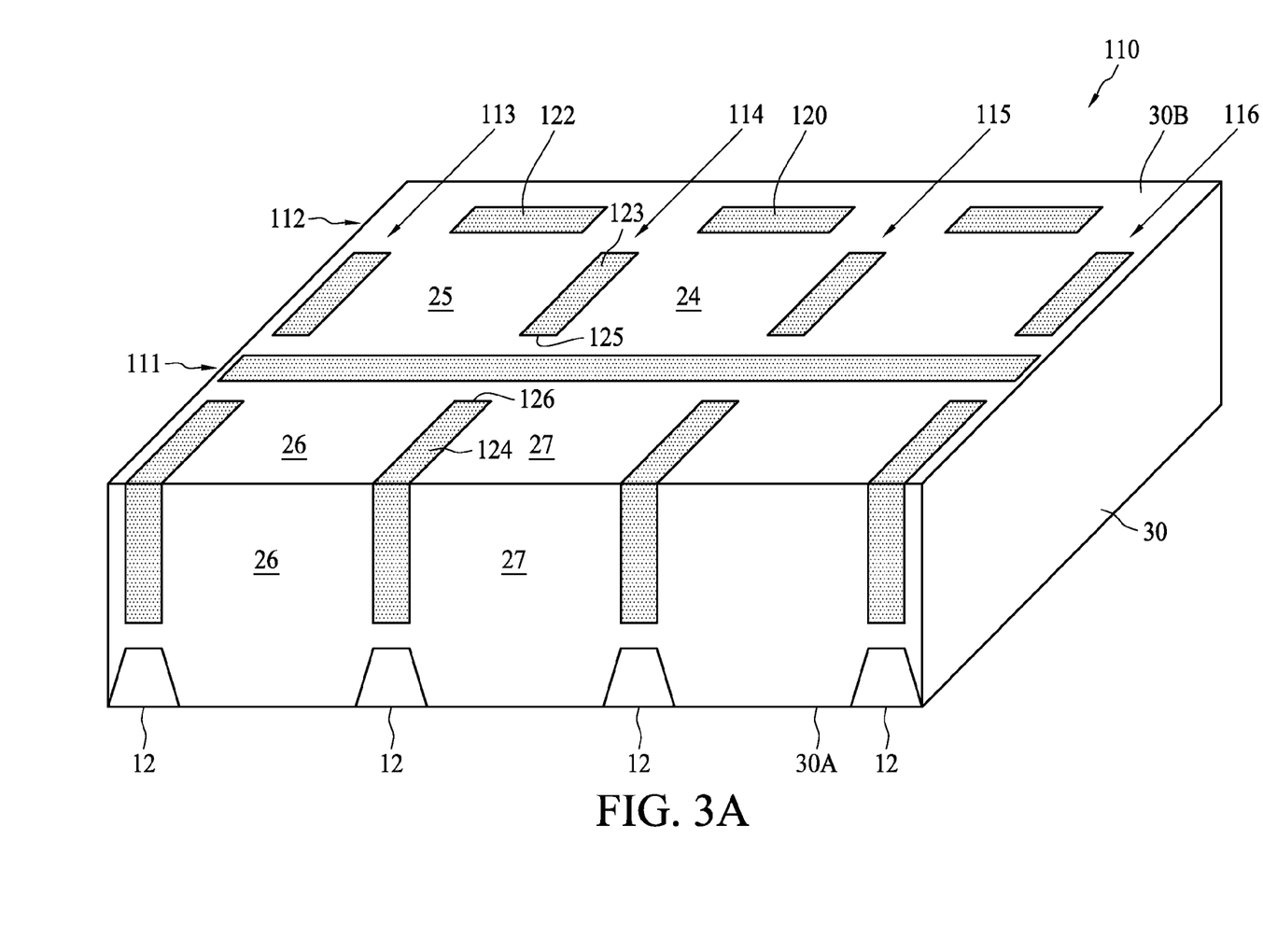
FIGS. 3A-3B represent a portion of a back side illuminated (BSI) image sensor device in accordance with some embodiments of the present disclosure.

FIG. 3A represents a portion of a back side illuminated (BSI) image sensor device in accordance with some embodiments of the present disclosure. A DTI grid 110 is formed at the back side 30B, wherein the DTI grid 110 extends from the back side 30B toward the front side 30A. The DTI grid 110 includes a continuous strip 111 and segmented strips 112, 113, 114, 115 and 116. The DTI grid 110 defines an array of image sensing units, for example, the image sensing units 24, 25, 26 and 27. The continuous strip 111 is in parallel to the segmented strip 112, wherein a section 120 or 122 of the segmented strip 112 is much shorter than the continuous strip 111. The section 120 is lined up with the section 122, wherein the sections 120 and 122 are separated by a distance. The image sensing unit 24 is interposed between the section 120 and the continuous strip 111; and the image sensing unit 25 is interposed between the section 122 and the continuous strip 111. Rows of the image sensing units, which is a row of image sensing units 24 and 25 and another row of the image sensing units 26 and 27, are separated by the continuous strip 111. The segmented strips 113, 114, 115 and 116 are in parallel to each other, wherein the segmented strip 113, 114, 115 or 116 intersects the continuous strip 111 without connection. For example, the continuous strip 111 is interposed between sections 123 and 124 of the segmented strip 114 by a separation from each of the sections 123 and 124. Further, short sides 125 and 126 of the sections 123 and 124 face toward the continuous strip 111. That is, the section 123 or 124 is located adjacent to but separated from the continuous strip 111 by a few microns.

Figure 3B:
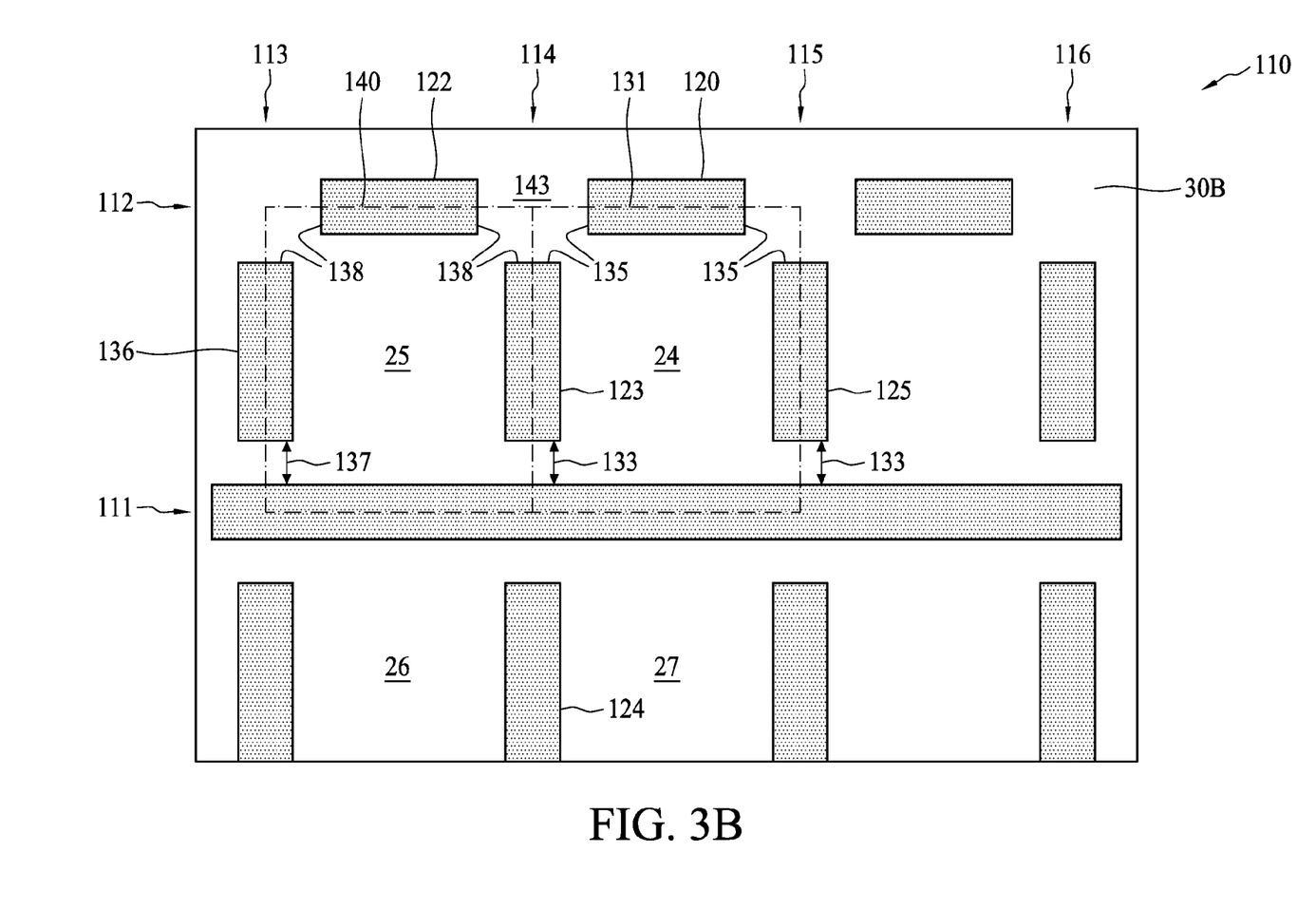

FIG. 3B represents a top view of the segmented strips of the BSI image sensor device of FIG. 3A in accordance with some embodiments of the present disclosure. The sections 120, 123, and 125 and the continuous strip 111 can be regarded as a DTI loop 131 of the DTI grid 110, wherein the DTI loop 131 circulates the image sensing unit 24 and includes openings 133 and open ends 135 at four corners of the DTI loop 131. The openings 133 are located between the section (123 or 125) and the continuous strip 111. The open ends 135 result from a disconnection between the section 120 and the section (123 or 125). Another DTI loop 140 circulates a sensing image unit 25 and is located adjacent to the DTI loop 131, wherein the DTI loop 140 is implemented by the sections 122, 123, and 136 and the continuous strip 111. The section 123 is shared by the DTI loops 131 and 140. The continuous strip 111 is longer than the sections 120 or 122 and performs as a common side for the DTI loops 131 and 140. The DTI loop 140 also includes openings (133, 137) and open ends 138 at four corners of the DTI loop 140. The opening 137 is located between the section 136 and the continuous strip 111. The open ends 138 result from a disconnection between the section 122 and the section (123 or 136). A separation 143, which is caused by the open ends 135 and 138, is in the center of 2×2 image sensing units 24, 25, and two adjacent image sensing units (not shown). The intersections of the DTI grid 110 are implemented as the separation 143 or a crossing by only one strip, such as the continuous strip 111. By avoiding a crossover of the strips, the arrangement at the intersection of segmented strips is able to reduce the loading effect occurred at crossover regions when etching the deep trenches. Deep trenches for the continuous strip 111 or the sections (such as 120 and 122) have a uniform depth. Without the loading effect, the performance of the BSI image sensor device can be improved. In addition, the arrangement of the separation 143 or a crossing by only one strip reduces damages or defects, which are easily formed in the crossover by etching. As such, the dark current and crosstalk issues can be eliminated.

FIGS. 4A-4D represent a method of manufacturing a BSI image sensor device in accordance with some embodiments of the present disclosure. Each figure represents a stage of the method in a cross-sectional perspective view.

Figure 4A:
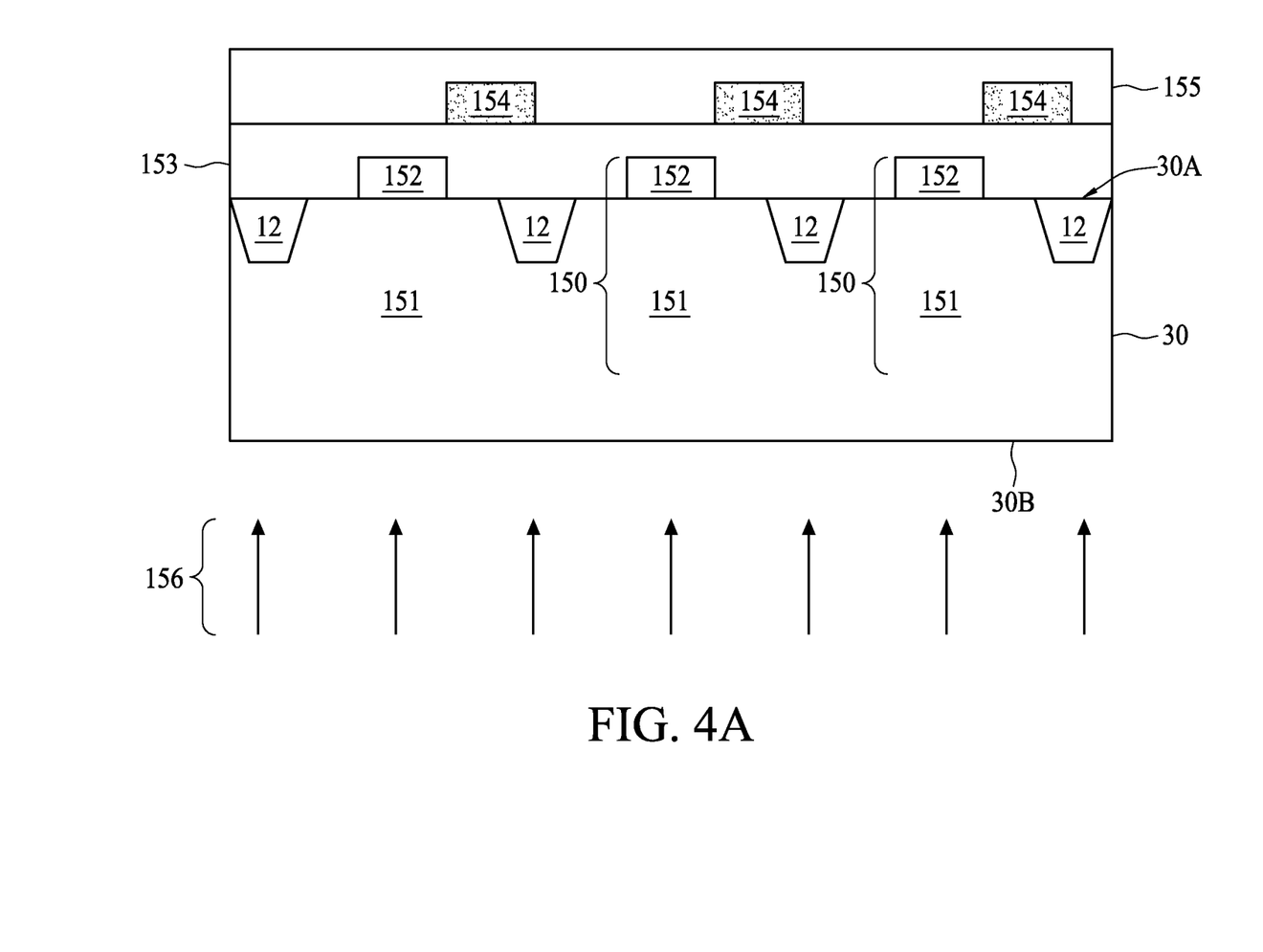
FIGS. 4A-4D represent a method of manufacturing a back side illuminated (BSI) image sensor device in accordance with some embodiments of the present disclosure.

Referring to FIG. 4A, a substrate 30 having a front side 30A and a back side 30B is provided. A local oxidation of silicon (LOCOS) or a Shallow Trench Isolation (STI) process is performed to define active regions of image pixels. Thus, the substrate 30 includes isolations 12 at the front side 30A configured to isolate image pixels 150. The isolations 12 are formed by etching a shallow opening into the substrate 30 from the front side 30A and filling the opening with an oxide material or a nitride material. The isolations 12 have a depth that is less than 1 um. During formation of the imaging pixels 150, at least one ion implantation is performed on the front side 30A to form radiation-sensing units 151 in the substrate 30. The radiation-sensing units 151 are implemented as a diode or a pinned diode by implanting p-type and n-type dopants with different depth and energy. The radiation-sensing units 151 are formed between the isolations 12. Next, gate structures 152 are formed on the front side 30A, wherein a gate dielectric layer, a gate electrode layer and a hard mask layer are deposited by using methods such as CVD, PVD, or ALD and then patterned to form a stack (not shown). Later, a conformal layer of gate sidewall material is deposited on the stack in a blanketed fashion by using a CVD process with an appropriate thickness. Thereafter, the conformal layer of gate sidewall material is subjected to an anisotropic etch, thus resulting in a sidewall spacer and forming the gate structures 152.

After formation of the gate structures 152, an interlayer (or inter-level) dielectric (ILD) layer 153 is formed by a technique including spin-on coating, CVD, sputtering, or other suitable processes. A planarization, such as a Chemical Mechanical Polishing (CMP), is utilized on the ILD layer 153. Next, at least one metal layer is formed on the ILD layer 153. The metal layer includes, for example, nickel, cobalt, tungsten, tantalum, titanium, platinum, erbium, palladium, or combinations thereof. Later, a photolithography and an etching process are performed to pattern the metal layer. Thus, a multilayer interconnect (MLI) 154 is formed on the ILD layer 153, wherein the MLI 154 has specific layout and is coupled with the gate structures 152. After formation of the MLI 154, an interlayer (or inter-level) dielectric (ILD) layer 155 is formed on the MLI 154. The ILD layer 155 includes dielectric materials such as silicon oxide.

A thinning process 156 is performed to thin the substrate 30 from the back side 30B. For example, the thinning process 156 includes a Chemical Mechanical Polishing (CMP)/Planarization process. Alternatively, the thinning process 156 includes a diamond scrubbing process, a grinding process, or other suitable techniques. A substantial amount of material may be removed from the back side 30B by the thinning process 156. After the thinning process 156, the substrate 30 is thin enough so that the radiation-sensing units 151 can efficiently receive radiation waves that enter form the back side 30B.

Figure 4B:
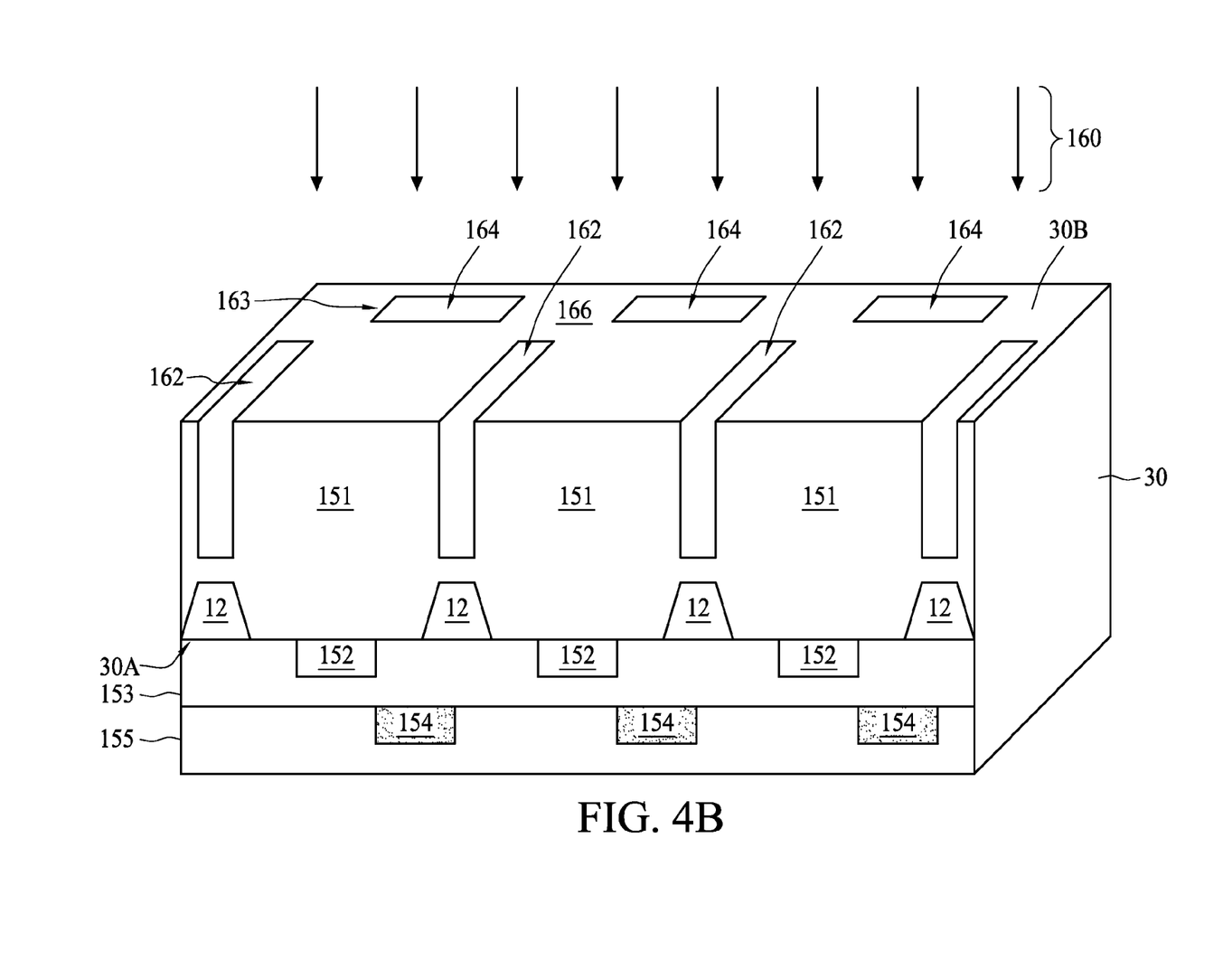

Referring to FIG. 4B, a mask or photoresist (not shown) is formed on the back side 30B and then patterned. An etch process 160 is performed to etch the substrate 30 through the mask, thus removing exposed portions of the back side 30B. The etch process 160 utilizes a wet etching or a dry etching with an anisotropy feature, for example, reactive ions etch (RIE). The etch process 160 includes chemistry molecules, which are ionized and react with materials of the substrate 30 but not the mask. Further, the etch process 160 includes chemistry molecules, such as $Cl_2$, $SF_6$, $N_2$, $CF_4$, $CHF_3$, $CH_2F_2$, $N_2H_2$, $O_2$, He or Ar. Accordingly, deep trenches 162 are formed in the substrate 30, wherein the deep trenches 162 extend from the back side 30B toward the front side 30A. Each deep trench 162 is formed between two radiation-sensing units 151 and are in parallel to each other. Further, a segmented ditch 163 is also formed at the back side 30B and intersects with the deep trenches 162, wherein the segmented ditch 163 and the deep trenches 162 define the radiation-sensing units 151. The segmented ditch 163 includes portions 164, wherein each portion 164 is isolated and separated with an adjacent portion by a distance. The portions 164 and the deep trenches 162 surround the radiation-sensing units 151 and form an open loop. In particular, the portions 164 do not joint together with the deep trenches 162; that is, an intersection 166 remains adjacent to the portions 164 and the deep trenches 162. Since the longitudinal ditches (deep trenches 162) and lateral ditches (portions 164) will not form a crossover region and do not communicate with each other, the intersection 166 is able to eliminate the loading effect occurred at crossover regions. That is, a crisscross or crossover region of the grid pattern is avoided so as to prevent a deeper depth at crossover regions than depths of longitudinal or lateral ditches. The portions 164 and the deep trenches 162 will have a uniform depth so that manufacturers do not have to adjust an exposure of lithography or the etching process 160 on different regions of the back side 30B. In addition, by using the intersection 166, damages or defects (such as dangling bonds or interface charges) on the surfaces of the deep trenches at crossover regions resulting from the etching process 160 can be avoided. The dark current, electrical crosstalk and degradation of the BSI image sensor device can be eliminated.

Figure 4C:
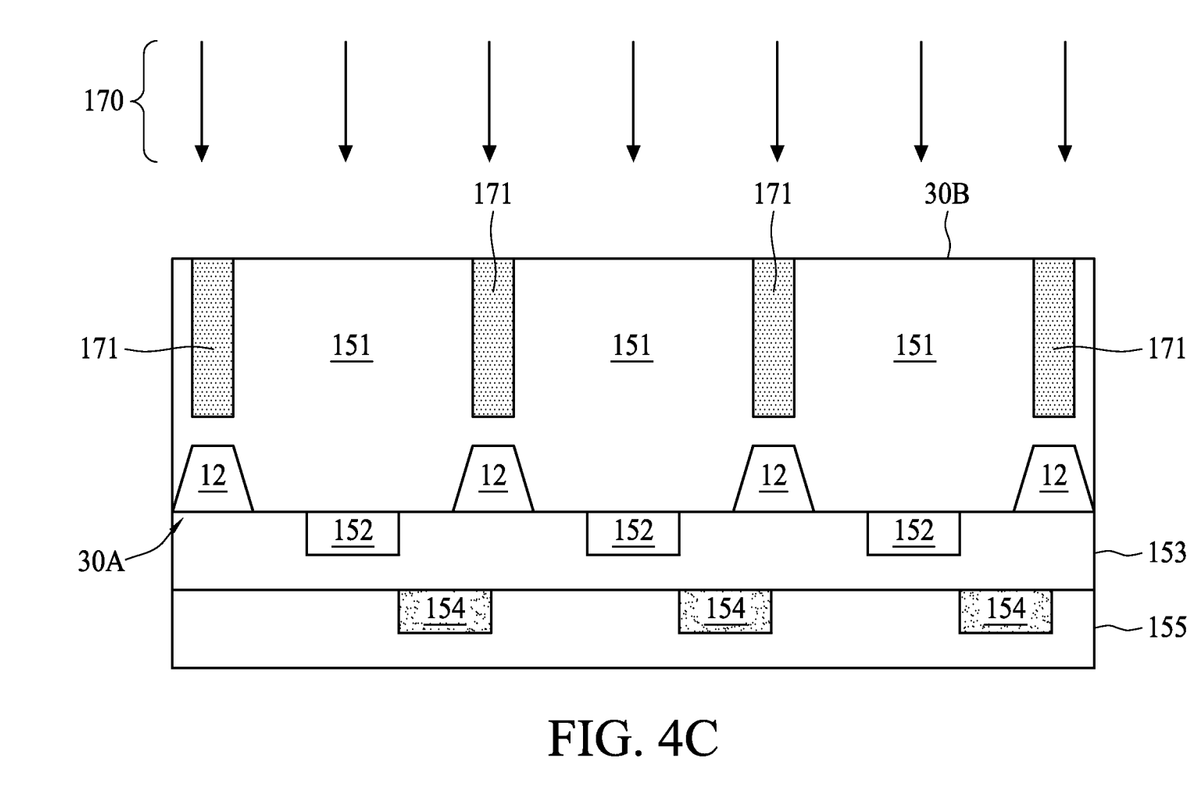

Referring to FIG. 4C, a deposition 170 illustrated as arrows is performed to fill dielectric materials into the deep trenches 162 and the portions 164 so as to form deep trench isolations (DTIs) 171. The deposition 170 includes dielectric materials, such as silicon oxide, silicon nitride, silicon carbon, or SiON. Later, portions of dielectric materials outside the deep trenches 162 and the portions 164 are removed by a chemical mechanical polishing (CMP) process.

Figure 4D:
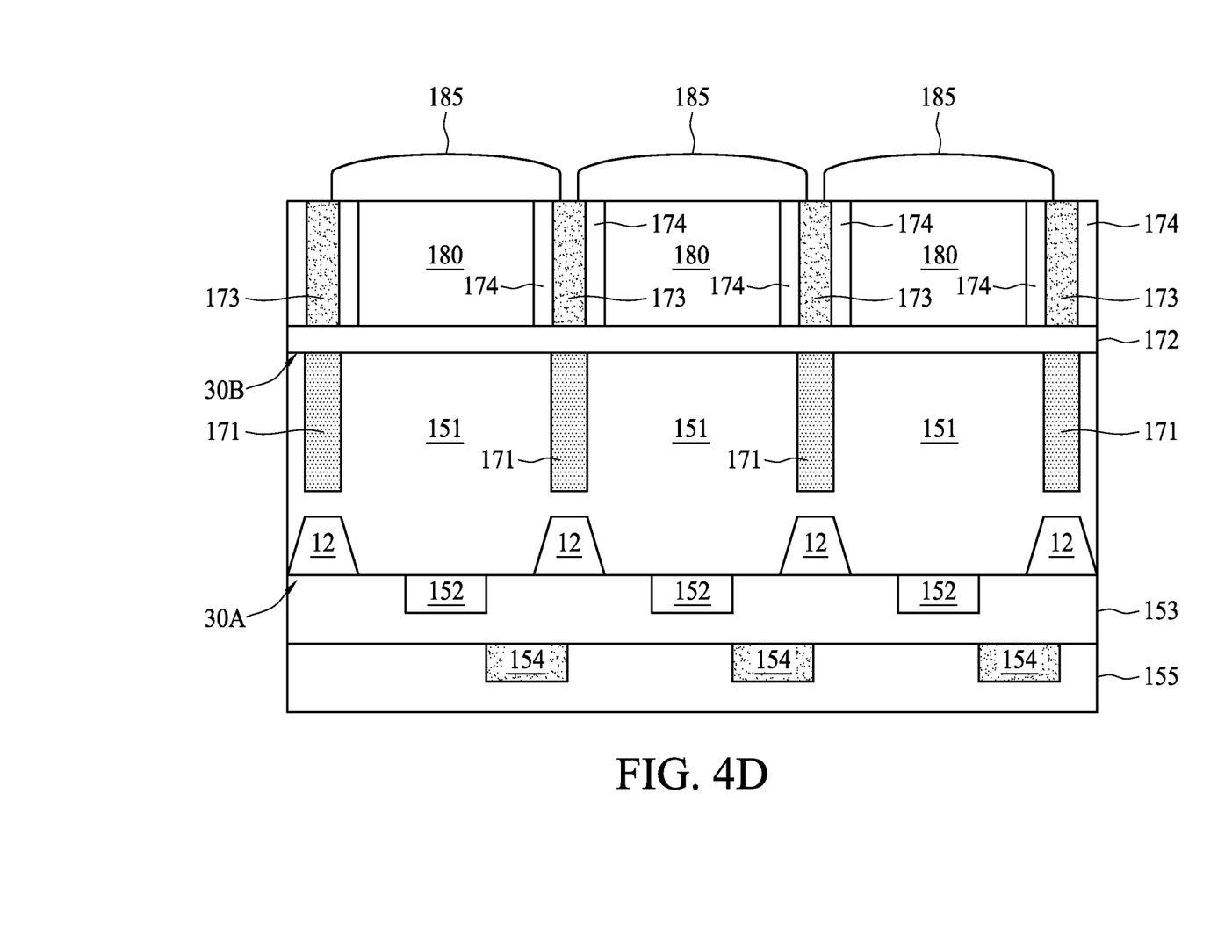

Referring to FIG. 4D, a buffer layer 172 is disposed on the back side 30B. The buffer layer 172 serves as planarization for structures of next stages. Material of the buffer layer 172 includes dielectric materials such as silicon oxide. A metal grid 173 is formed over the buffer layer 172. Regarding formation of the metal grid 173, a grid material layer is deposited on the buffer layer 172 and is patterned to form openings. Remaining portion of the grid material layer forms guiding grids of the metal grid 173. Each guiding grid of the metal grid 173 is aligned with the DTIs 171 and corresponds to the radiation-sensing units 151. In some embodiments, the grid material layer includes a metal(s) or a metal alloy such as tungsten, aluminum, copper, and/or combination thereof. In an embodiment, a dielectric layer 174 is deposited on sidewalls of the guiding grids of the metal grid 173 for protection. The dielectric layer 174 includes dielectric materials such as silicon oxide. A plurality of color filters 180 are formed in openings of the metal grid 173. The color filters 180 include a resin or other organic-based material having color pigments. Further, the color filters 180 are aligned with the radiation-sensing units 151 respectively. Later, a plurality of micro lenses 185 is formed over the color filters 180. The micro lenses 185 align with the radiation-sensing units 151 respectively. The micro lenses 185 include a suitable material, such as glass or polymer. The micro lenses 185 focus radiation waves on the radiation-sensing units 151.

In brief, a deep trench isolation (DTI) grid is formed in the substrate. The DTI grid has a pattern where intersections of the DTI grid are disconnected or are crossed by only one strip. In an embodiment, separations are at the center of the intersections so that a loading effect occurred at crossover regions can be reduced while etching deep trenches. In an embodiment, only one strip crosses over the intersections; and the other strip is disconnected so that a crisscross or a crossover region is avoided. By avoiding the crossover region, the loading effect occurred at crossover regions can be eliminated. In addition, the pattern arrangement is able to reduce damages or defects, which are easily induced at the crossover regions. As such, the dark current can be reduced so that performance of the BSI image sensor can be improved.

A back side illuminated (BSI) image sensor device, includes: a substrate including a front side and a back side opposite to the front side; a radiation-sensing region disposed in the substrate; and a deep trench isolation (DTI) grid disposed in the substrate and defining the radiation-sensing region. The DTI grid extends from the back side toward the front side, and includes a segmented strip in a top view from the back side.

In some embodiments, the segmented strip is parallel to another segmented strip, and an image sensing unit of the radiation-sensing region is interposed between the two segmented strips.

In some embodiments, the DTI grid includes a pair of adjacent and parallel segmented strips.

In some embodiments, the segmented strip is parallel to a continuous strip, and an image sensing unit of the radiation-sensing region is interposed between the segmented strip and the continuous strip.

In some embodiments, the DTI grid includes a pair of segmented strips, and section lengths between the pair of segmented strips are different.

In some embodiments, the segmented strip intersects a continuous strip.

In some embodiments, the continuous strip is interposed between two sections of the segmented strip with a separation from each one of the two sections.

In some embodiments, the segmented strip intersects another segmented strip.

In some embodiments, the DTI grid includes a pair of adjacent segmented strips and an image sensing unit of the radiation-sensing region is surrounded by sections of the pair of segmented strips.

In some embodiments, the DTI grid includes a pair of orthogonally intersected segmented strips.

In some embodiments, the segmented strip includes two sections separated by a distance ranging from about 0.1 µm to 1 µm.

In some embodiments, the segmented strip includes two sections separated by a distance; the distance is in a range from about 5% to 20% of a length of one of the two sections.

A back side illuminated (BSI) image sensor device, includes: a substrate including a front side and a back side opposite to the front side; and an array of a radiation-sensing region includes an image sensing unit defined by a deep trench isolation (DTI) loop. The DTI loop includes an open end and extends from the back side toward the front side.

In some embodiments, the open end is located on a side of the DTI loop.

In some embodiments, the open end is located at a corner of the DTI loop.

In some embodiments, two adjacent rows of the array of the radiation-sensing region are separated by a continuous strip of the DTI loop.

In some embodiments, two adjacent rows of the array of the radiation-sensing region are separated by a segmented strip of the DTI loop.

In some embodiments, the open end is at a center of a 2×2 image sensing array in the array of the radiation-sensing region.

A method for manufacturing a back side illuminated (BSI) image sensor device includes: providing a substrate having a front side and a back side opposite to the front side; forming a radiation-sensing region in the substrate; forming a segmented ditch extending from the back side toward the front side, wherein the segmented ditch defines the radiation-sensing region; and forming a dielectric material within the deep trench.

In some embodiments, the method further includes forming another segmented ditch intersecting with or in parallel to the segmented ditch.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A back side illuminated (BSI) image sensor device, comprising:
   a substrate including a front side and a back side opposite to the front side;
   a radiation-sensing region disposed in the substrate; and
   a deep trench isolation (DTI) grid disposed in the substrate and defining the radiation-sensing region,
   wherein the DTI grid extends from the back side toward the front side, and comprises a segmented strip and a continuous strip in a top view from the back side.

2. The BSI image sensor device of claim 1, wherein the segmented strip is parallel to another segmented strip, and an image sensing unit of the radiation-sensing region is interposed between the two segmented strips.

3. The BSI image sensor device of claim 1, wherein the DTI grid comprises a pair of adjacent and parallel segmented strips.

4. The BSI image sensor device of claim 1, wherein the segmented strip is parallel to the continuous strip, and an image sensing unit of the radiation-sensing region is interposed between the segmented strip and the continuous strip.

5. The BSI image sensor device of claim 1, wherein the DTI grid comprises a pair of segmented strips, and section lengths between the pair of segmented strips are different.

6. The BSI image sensor device of claim 1, wherein the segmented strip intersects the continuous strip.

7. The BSI image sensor device of claim 6, wherein the continuous strip is interposed between two sections of the segmented strip with a separation from each one of the two sections.

8. The BSI image sensor device of claim 1, wherein the segmented strip intersects another segmented strip.

9. The BSI image sensor device of claim 1, wherein the DTI grid comprises a pair of orthogonally intersected segmented strips.

10. The BSI image sensor device of claim 1, wherein the segmented strip comprises two sections separated by a distance ranging from about 0.1 µm to 1 µm.

11. The BSI image sensor device of claim 1, wherein the segmented strip comprises two sections separated by a distance, the distance is in a range from about 5% to 20% of a length of one of the two sections.

12. A back side illuminated (BSI) image sensor device, comprising:
   a substrate including a front side and a back side opposite to the front side; and
   an array of a radiation-sensing region comprising an image sensing unit defined by a deep trench isolation (DTI) loop, wherein the DTI loop comprises an open end and extends from the back side toward the front side, and two adjacent rows of the array of the radiation-sensing region are separated by a continuous strip of the DTI loop.

13. The BSI image sensor device of claim 12, wherein the open end is located on a side of the DTI loop.

14. The BSI image sensor device of claim 12, wherein the open end is located at a corner of the DTI loop.

15. The BSI image sensor device of claim 12, wherein the open end is at a center of a 2×2 image sensing array in the array of the radiation-sensing region.

16. A method for manufacturing a back side illuminated (BSI) image sensor device comprising:
   providing a substrate having a front side and a back side opposite to the front side;
   forming a radiation-sensing region in the substrate;
   forming a segmented ditch extending from the back side toward the front side, wherein the segmented ditch defines the radiation-sensing region;
   filling a dielectric material within the segmented ditch to form a segmented strip of a deep trench isolation (DTI) grid; and
   forming a shallow trench isolation (STI) grid extending from the front side toward the back side, wherein the STI grid is substantially aligned with the DTI grid.

17. The method of claim 16, further comprising:
   forming another segmented ditch intersecting with or in parallel to the segmented ditch.

18. The BSI image sensor device of claim 12, further comprising a shallow isolation loop extending from the front side toward the back side, wherein the shallow isolation loop is substantially aligned with the DTI loop.

19. The BSI image sensor device of claim 12, wherein the DTI loop further comprises a segmented strip.

20. The BSI image sensor device of claim 19, wherein the segmented strip intersects the continuous strip.

* * * * *